(12) United States Patent
Zhang et al.

(10) Patent No.: US 11,705,897 B2
(45) Date of Patent: Jul. 18, 2023

(54) DELAY LINE WITH PROCESS-VOLTAGE-TEMPERATURE ROBUSTNESS, LINEARITY, AND LEAKAGE CURRENT COMPENSATION

(71) Applicant: QUALCOMM Incorporated, San Diego, CA (US)

(72) Inventors: Xu Zhang, San Diego, CA (US); Xuhao Huang, San Diego, CA (US); Shitong Zhao, San Diego, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 0 days.

(21) Appl. No.: 17/495,608

(22) Filed: Oct. 6, 2021

(65) Prior Publication Data

US 2023/0105664 A1 Apr. 6, 2023

(51) Int. Cl.
| | |
|---|---|
| *H03K 5/14* | (2014.01) |
| *H03K 3/03* | (2006.01) |
| *G05F 1/56* | (2006.01) |
| *H03F 3/45* | (2006.01) |
| *H04B 1/40* | (2015.01) |

(52) U.S. Cl.
CPC .............. *H03K 5/14* (2013.01); *G05F 1/56* (2013.01); *H03F 3/45475* (2013.01); *H03K 3/0315* (2013.01); *H04B 1/40* (2013.01)

(58) Field of Classification Search
CPC ......... H04B 1/40; H03F 3/45475; G05F 1/56; H03K 5/14
See application file for complete search history.

(56) References Cited

U.S. PATENT DOCUMENTS

| | | | |
|---|---|---|---|
| 8,362,848 B2 * | 1/2013 | Raghunathan | H03L 7/0995 327/158 |
| 10,110,239 B1 | 10/2018 | Shu et al. | |
| 10,469,090 B1 * | 11/2019 | Zheng | H03L 7/0805 |
| 2002/0101947 A1 * | 8/2002 | Sumiyoshi | H03L 7/0816 713/400 |
| 2008/0068056 A1 * | 3/2008 | Poulton | H03L 7/099 327/156 |
| 2014/0237310 A1 * | 8/2014 | Cheng | G01R 31/318541 714/727 |
| 2016/0336924 A1 * | 11/2016 | Yu | H03K 3/011 |
| 2017/0012584 A1 | 1/2017 | Lee et al. | |
| 2017/0083031 A1 * | 3/2017 | Atallah | G05F 1/56 |
| 2019/0229713 A1 * | 7/2019 | Krishna | H03B 5/04 |
| 2019/0258281 A1 | 8/2019 | Ates | |
| 2021/0011506 A1 * | 1/2021 | Lee | G05F 1/575 |

FOREIGN PATENT DOCUMENTS

WO 2020062099 A1 4/2020

OTHER PUBLICATIONS

International Search Report and Written Opinion—PCT/US2022/044272—ISA/EPO—dated Dec. 12, 2022.
Maymandi-Nejad M., et al., "A Monotonic Digitally Controlled Delay Element", IEEE Journal of Solid-State Circuits, IEEE, USA, vol. 40, No. 11, Nov. 1, 2005, XP011141629, pp. 2212-2219.

* cited by examiner

*Primary Examiner* — Patrick C Chen
(74) *Attorney, Agent, or Firm* — Loza & Loza, LLP

(57) ABSTRACT

An aspect relates to an apparatus, including: a ring oscillator coupled between a first node and a first voltage rail; a control circuit coupled to the first node; a delay line coupled between a second node and the first voltage rail; and a voltage regulator including an input coupled to the first node and an output coupled to the second node.

21 Claims, 7 Drawing Sheets

DELAY LINE WITH PROCESS-VOLTAGE-TEMPERATURE ROBUSTNESS, LINEARITY, AND LEAKAGE CURRENT COMPENSATION

FIELD

Aspects of the present disclosure relate generally to signal delay lines, and in particular, to a signal delay circuit with process-voltage-temperature (PVT) robustness, linearity, and leakage current compensation.

BACKGROUND

A delay line is used in many circuits to impart a delay to an input signal (e.g., an input clock) to generate an output signal (e.g., output clock). So that the imparted delay is accurate and predictable, the delay should not change substantially with process-voltage-temperature (PVT) variation. It may be further desired that the variation of the delay with a delay control signal is substantially linear so that accurate and predictable delays may be achieved by properly setting the delay control signal. Additionally, it may be desirable to sense leakage current in the delay line circuitry and compensate the delay line circuitry for the leakage current; as otherwise, accurate and predictable delays may not be achievable especially in certain technology nodes sensitive to temperature variation.

SUMMARY

The following presents a simplified summary of one or more implementations in order to provide a basic understanding of such implementations. This summary is not an extensive overview of all contemplated implementations and is intended to neither identify key or critical elements of all implementations nor delineate the scope of any or all implementations. Its sole purpose is to present some concepts of one or more implementations in a simplified form as a prelude to the more detailed description that is presented later.

An aspect of the disclosure relates to an apparatus. The apparatus includes a ring oscillator coupled between a first node and a first voltage rail; a control circuit coupled to the first node; a delay line coupled between a second node and the first voltage rail; and a voltage regulator including an input coupled to the first node and an output coupled to the second node.

Another aspect of the disclosure relates to a method. The method includes generating an oscillating signal based on a first voltage and a first current; controlling the first voltage and the first current such that a ratio of the first voltage to the first current is substantially a constant; and delaying an input signal to generate an output signal based on a second voltage related to the first voltage.

Another aspect of the disclosure relates to an apparatus. The apparatus includes means for generating an oscillating signal based on a first voltage and a first current; means for controlling the first voltage and the first current such that a ratio of the first voltage to the first current is substantially a constant; and means for delaying an input signal to generate an output signal based on a second voltage related to the first voltage.

Another aspect of the disclosure relates to a wireless communication device. The wireless communication device includes one or more baseband signal processing modules; at least one antenna; a transceiver coupled to the at least one antenna and the one or more baseband signal processing modules, wherein the transceiver includes: a ring oscillator coupled between a first node and a first voltage rail; a control circuit coupled to the first node; a delay line coupled between a second node and the first voltage rail; and a voltage regulator including an input coupled to the first node and an output coupled to the second node.

To the accomplishment of the foregoing and related ends, the one or more implementations include the features hereinafter fully described and particularly pointed out in the claims. The following description and the annexed drawings set forth in detail certain illustrative aspects of the one or more implementations. These aspects are indicative, however, of but a few of the various ways in which the principles of various implementations may be employed and the description implementations are intended to include all such aspects and their equivalents.

DETAILED DESCRIPTION

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. However, it will be apparent to those skilled in the art that these concepts may be practiced without these specific details. In some instances, well-known structures and components are shown in block diagram form in order to avoid obscuring such concepts.

Delay lines are used in many applications. For example, delay lines may be used in phase shifters, time-based analog-to-digital converters (ADCs), multi-phase clock generators, digital-to-time converters (DTCs), time-to-digital converters (TDCs), phase locked loops (PLLs), delay locked loops (DLLs) systems, time measuring systems, and others. In such applications, controlling such delay lines to provide accurate and predictable delays is often of interest. In this regard, delay lines and associated control circuits are designed to provide process-voltage-temperature (PVT) stable time delays, substantially linear delay transfer responses with input delay control signal (e.g., input code), and compensate for leakage current, which may affect achieving accurate and predictable delays.

Figure 1:
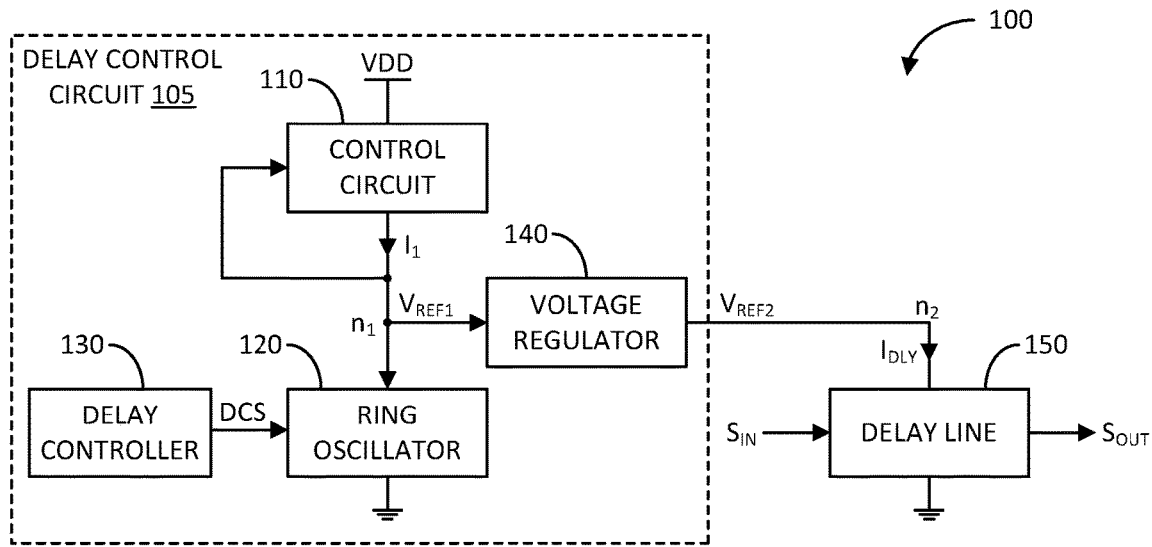
FIG. 1 illustrates a block diagram of an example signal delay circuit in accordance with an aspect of the disclosure.

FIG. 1 illustrates a block diagram of an example signal delay circuit 100 in accordance with an aspect of the disclosure. The signal delay circuit 100 includes a delay line 150 configured to receive an input signal $S_{IN}$ (e.g., a clock) and generate an output signal $S_{OUT}$ (e.g., a delayed clock) being a delayed version of the input signal $S_{IN}$. The amount of delay of the input signal $S_{IN}$ imparted by the delay line 150 to generate the output signal $S_{OUT}$ is based on a reference voltage $V_{REF2}$ provided to the delay line 150. The signal delay circuit 100 includes a delay control circuit 105 configured to generate the reference voltage $V_{REF2}$ at node $n_2$. The delay line 150 is coupled between node $n_2$ and a lower voltage rail (e.g., ground).

The signal delay circuit 100 further includes a delay control circuit 105 including a control circuit 110 (e.g., controls the operating point (OP) of a ring oscillator (RO)), a ring oscillator 120, a delay controller 130, and a voltage regulator 140. The control circuit 110 and the ring oscillator 120 are coupled in series between an upper voltage rail VDD and the lower voltage rail (e.g., ground). In some implementations, the control circuit 110 is configured to control an operating point ($V_{REF1}/I_1$) of the ring oscillator 120 such that it exhibits a substantially linear voltage/current response (e.g., a function of a substantially constant slope). An operating point, as used herein, is target voltage $V_{REF1}$ and current $I_1$ provided to the ring oscillator 120. As discussed further herein, the linear voltage/current response translates to a PVT stable delay to an input signal imparted by the delay line 150 and a substantially linear relationship between a delay control signal (DCS) and a resulting delay to an input signal imparted by the delay line 150.

The delay controller 130 is coupled to the ring oscillator 120 to provide it a delay control signal (DCS). As discussed further herein, the delay control signal (DCS) controls the number of inverters enabled in the ring oscillator 120, which affects an intrinsic current/voltage response of the ring oscillator 120. That is, the more inverters enabled, the higher the intrinsic current/voltage response of the ring oscillator 120; and the fewer inverters enabled, the lower the intrinsic current/voltage response of the ring oscillator 120.

The control circuit 110 has an intrinsic voltage current/voltage response that is substantially linear. The control circuit 110 controls the current $I_1$ supplied to the ring oscillator 120 such that the ring oscillator 120 exhibits the substantially linear current/voltage response of the control circuit 110. Accordingly, the control circuit 110 controls the reference voltage $V_{REF1}$ and the current $I_1$ to maintain the operating point along a linear current $I_1$ versus reference voltage $V_{REF1}$ in response to the delay controller 130 controlling the ring oscillator 120 as discussed. The voltage regulator 140 generates the reference voltage $V_{REF2}$ based on the reference voltage $V_{REF1}$ (e.g., $V_{REF2}$ is substantially equal to $V_{REF1}$).

As discussed above, the delay line 150 delays the input signal $S_{IN}$ to generate the output signal Spur based on (e.g., related to) the reference voltage $V_{REF2}$. Accordingly, if the reference voltage $V_{REF2}$ increases, the current $I_{DLY}$ drawn by the delay line 150 increases non-linearly more than the reference voltage $V_{REF2}$. As the delay $T_{DLY}$ imparted to the input signal $S_{IN}$ by the delay line 150 may be related to the following relationship: $T_{DLY} \sim C_L \cdot V_{REF2}/I_{DLY}$, the delay imparted to the input signal $S_{IN}$ by the delay line 150 decreases with the increase in the reference voltage $V_{REF2}$. Similarly, if the reference voltage $V_{REF2}$ decreases, the current $I_{DLY}$ drawn by the delay line 150 decreases non-linearly less than the reference voltage $V_{REF2}$. Thus, according to the relationship $T_{DLY} \sim C_L \cdot V_{REF2}/I_{DLY}$, the delay imparted to the input signal $S_{IN}$ by the delay line 150 increases with the decrease in the reference voltage $V_{REF2}$.

The control of the delay line 150 by the delay control circuit 105 operates as follows: If a smaller delay of the input signal $S_{IN}$ is desired, the delay controller 130 tunes (increases) the reference voltage $V_{REF1}$ by generating the delay control signal (DCS) to enable fewer inverters in the ring oscillator 120. This causes the control circuit 110 to increase the current $I_1$ and the reference voltage $V_{REF1}$. In response to the increased reference voltage $V_{REF1}$, the voltage regulator 140 increases the reference voltage $V_{REF2}$, which causes the delay line 150 to decrease the delay imparted to the input signal $S_{IN}$ to generate the output signal $S_{OUT}$.

Conversely, if a larger delay of the input signal $S_{IN}$ is desired, the delay controller 130 tunes (decreases) the reference voltage $V_{REF1}$ by generating the delay control signal (DCS) to enable more inverters in the ring oscillator 120. This causes the control circuit 110 to decrease the current $I_1$ and the reference voltage $V_{REF1}$. In response to the decreased reference voltage $V_{REF1}$, the voltage regulator 140 decreases the reference voltage $V_{REF2}$, which causes the delay line 150 to increase the delay imparted to the input signal $S_{IN}$ to generate the output signal $S_{OUT}$.

Figure 2A:
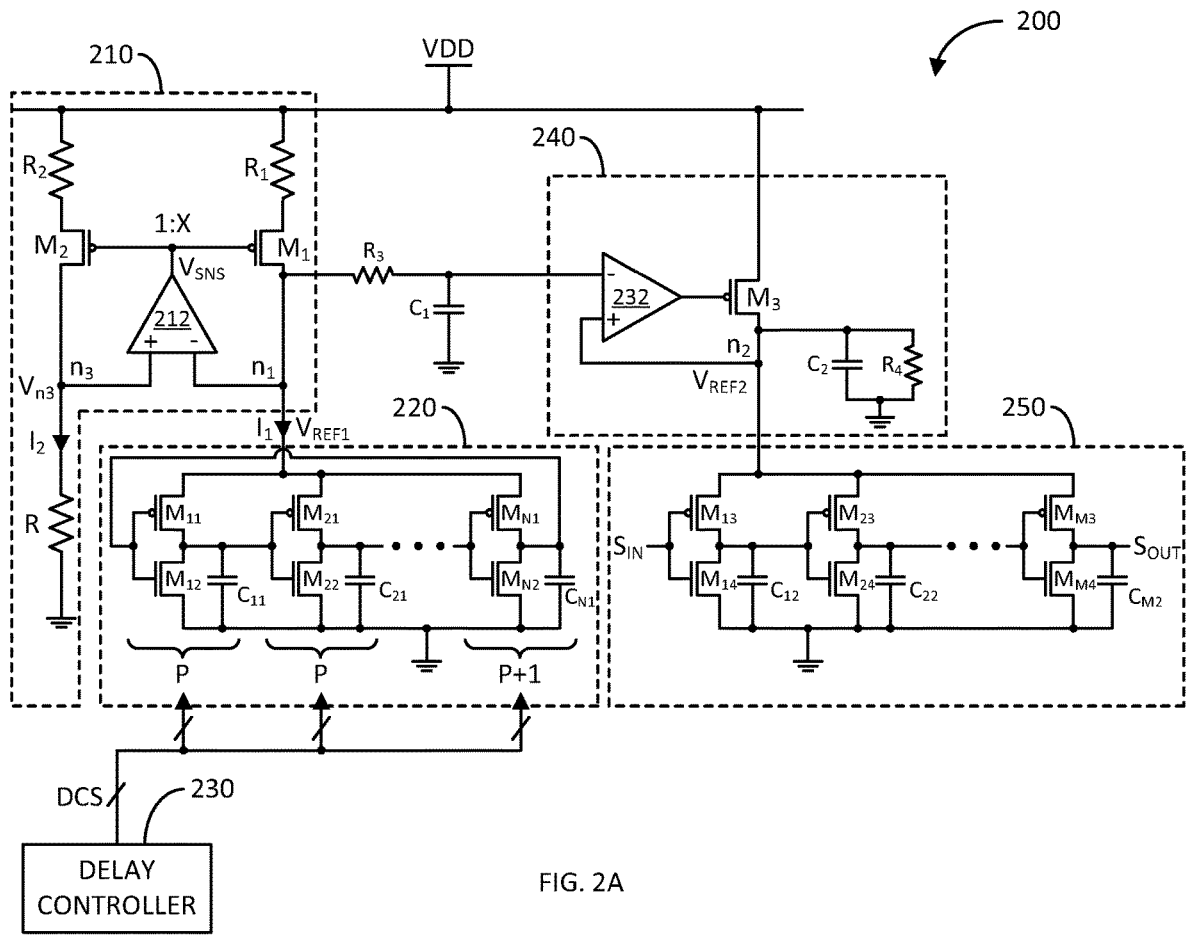
FIG. 2A illustrates a schematic diagram of another example signal delay circuit in accordance with another aspect of the disclosure.

FIG. 2A illustrates a schematic diagram of another example signal delay circuit 200 in accordance with another aspect of the disclosure. The signal delay circuit 200 may be an example more detailed implementation of the signal delay circuit 100 previously discussed. The signal delay circuit 200 includes a delay line 250 and a delay control circuit including a control circuit 210, a ring oscillator 220, a delay controller 230, and a voltage regulator 240.

The delay line 250 includes a set of M cascaded inverters $M_{13}/M_{14}$ to $M_{M3}/M_{M4}$, where M is an integer. Cascaded inverters mean the inverters are series connected between an input and an output; for example, the output of an inverter is coupled to an input of a following inverters. Each of the set of cascaded inverters includes a p-channel metal oxide semiconductor field effect transistor (PMOS FET) coupled in series with an n-channel metal oxide semiconductor field effect transistor (NMOS FET) between node $n_2$ and a lower voltage rail (e.g., ground). For example, the first inverter in the set of cascaded inverter includes PMOS FET Mia coupled in series with NMOS FET $M_{14}$, including gates coupled together (inverter input) and configured to receive an input signal $S_{IN}$ (e.g., a clock), and drains coupled together (inverter output). Similarly, the second inverter includes PMOS FET $M_{23}$ coupled in series with NMOS FET $M_{24}$, including gates (input) coupled to the output of the first inverter $M_{13}/M_{14}$, and drains (output) coupled together and to the input of the following inverter. This arrangement continues to the last inverter, which includes PMOS FET $M_{M3}$ coupled in series with NMOS FET $M_{M4}$, including gates (input) coupled to the output of the previous inverter, and drains coupled together (inverter output) and configured to generate an output signal $S_{OUT}$ (e.g., an output clock).

The delay line 250 may further include a set of M capacitors $C_{12}$ to $C_{M2}$ coupled between the outputs of the set of cascaded inverters $M_{13}/M_{14}$ to $M_{M3}/M_{M4}$ and the lower voltage rail (e.g., ground). Each of the set of M capacitors $C_{12}$ to $C_{M2}$ may be implemented as a discrete capacitor, such as a metal-insulator-metal (MIM) capacitor, a metal-oxide-metal (MOM) capacitor, a metal oxide semiconductor (MOS) capacitor, or other. Alternatively, each of the set of M capacitors $C_{12}$ to $C_{M2}$ may be implemented as designed parasites.

The ring oscillator 220 may be configured similar to the delay line 250 with the exception that the number N of cascaded inverters is an odd integer, and the output of the "last" inverter is coupled to the input of the "first" inverter. More specifically, the ring oscillator 220 includes a ring of N cascaded inverters $M_{11}/M_{12}$ to $M_{N1}/M_{N2}$. Each of the ring of cascaded inverters includes a PMOS FET coupled in series with an NMOS FET between node $n_1$ and the lower voltage rail (e.g., ground). For example, the "first" inverter in the ring of cascaded inverter includes PMOS FET Mu coupled in series with NMOS FET $M_{12}$, including gates (input) coupled together and to the output (drains) of the PMOS FET $M_{N1}$ and NMOS FET $M_{N2}$ of the "last" inverter. Similarly, the "second" inverter in the ring of cascaded inverter includes PMOS FET $M_{21}$ coupled in series with NMOS FET $M_{22}$, including gates (input) coupled to the output of the first inverter, and drains coupled together (inverter output) and to the input of the following inverter. This arrangement continues to the "last" inverter $M_{N1}/M_{N2}$. The ring oscillator 220 may use the same technology (e.g., complementary metal oxide semiconductor (CMOS)) and size FETs as those of the delay line 250.

The ring oscillator 220 may further include a set of M capacitors $C_{11}$ to $C_{N1}$ coupled between the outputs of the ring of cascaded inverters $M_{11}/M_{12}$ to $M_{N1}/M_{N2}$ and the lower voltage rail (e.g., ground). Each of the set of M capacitors $C_{11}$ to Cm may be implemented as a discrete capacitor, such as a MIM, MOM, MOS, or other type of capacitor. Alternatively, each of the set of M capacitors $C_{11}$ to Cm may be implemented as designed parasites.

The control circuit 210 includes a first current source including resistor $R_1$ and PMOS FET $M_1$ coupled in series with the ring oscillator 220 between an upper voltage rail VDD and the lower voltage rail (e.g., ground). The control circuit 210 further includes a second current source including resistor $R_2$ and PMOS FET $M_2$ coupled in series with a resistive device R between the upper voltage rail VDD and the lower voltage rail (e.g., ground). The gates of the PMOS FETs $M_1$ and $M_2$ are coupled together to form a current mirror, and may be sized to produce a current ratio $I_1/I_2$ of X (e.g., the size of PMOS FET $M_1$ is X times greater than the size of PMOS FET $M_2$). Additionally, the control circuit 210 includes an operational amplifier 212 including a first (e.g., negative) input coupled to node $n_1$ between the first current source $R_1/M_1$ and the ring oscillator 220, a second (e.g., positive) input coupled to node $n_3$ between the second current source $R_2/M_2$ and the resistive device R, and an output coupled to the control inputs (e.g., gates) of the current sources (e.g., PMOS FETs $M_1$ and $M_2$). The operational amplifier 212 is configured to generate a sense voltage $V_{SNS}$ based on a difference between a voltage $V_{n3}$ at node $n_3$ and the reference voltage $V_{REF1}$ at node $n_1$.

The delay controller 230 is configured to generate a delay control signal (DCS). As discussed in more detail herein, each of the set of cascaded inverters $M_{11}/M_{12}$ to $M_{N1}/M_{N2}$ of the ring oscillator 220 may include a set of parallel inverters. The delay control signal (DCS) may be configured to enable P number (an integer number larger than zero) of the set of parallel inverters in a first subset of one or more of the set of cascaded inverters $M_{11}/M_{12}$ to $M_{N1}/M_{N2}$, and enable P+1 in the remaining or second subset of one or more of the set of cascaded inverters $M_{11}/M_{12}$ to $M_{N1}/M_{N2}$. As previously discussed with reference to signal delay circuit 100, the current $I_1$ drawn by the ring oscillator 220 is related to the number $A*P+B*(P+1)$ of the total enabled inverters in the ring oscillator 220, where A is the number of cascaded inverters in the first subset and B is the number of cascaded inverters the second subset. A plus B equals to the stage number of the ring oscillator 220. As previously discussed, and discussed in more detail further herein, by controlling the number $A*P+B*(P+1)$ of enabled inverters in the ring oscillator 220, the delay imparted to the input signal $S_{IN}$ by the delay line 250 to generate the output signal Sour may be linearly controlled.

The voltage regulator 240 may be configured as a low dropout (LDO) voltage regulator. In this regard, the voltage regulator 240 includes an operational amplifier 232 and a PMOS FET $M_3$. The operational amplifier 232 includes a first (e.g., negative) input coupled to node $n_1$ (e.g., via a filter), a second (e.g., positive) input coupled to node $n_2$, and an output coupled to the gate of the PMOS FET $M_3$. The PMOS FET $M_3$ is coupled in series with the delay line 250 between the upper voltage rail VDD and the lower voltage rail (e.g., ground), wherein the node $n_2$ is situated between the PMOS FET $M_3$ and the delay line 250.

The voltage regulator 240 may include filters to reduce supply voltage noise, such as a first low pass filter (LPF) including series resistor $R_3$ coupled between node $n_1$ and the first (negative) input of the operational amplifier 232, and a shunt capacitor $C_1$ coupled between the negative input of the operational amplifier 232 and the lower voltage rail (e.g., ground), and a second LPF including capacitor $C_2$ and resistor $R_4$ coupled in parallel between node $n_2$ and the lower voltage rail (e.g., ground).

Figure 2B:
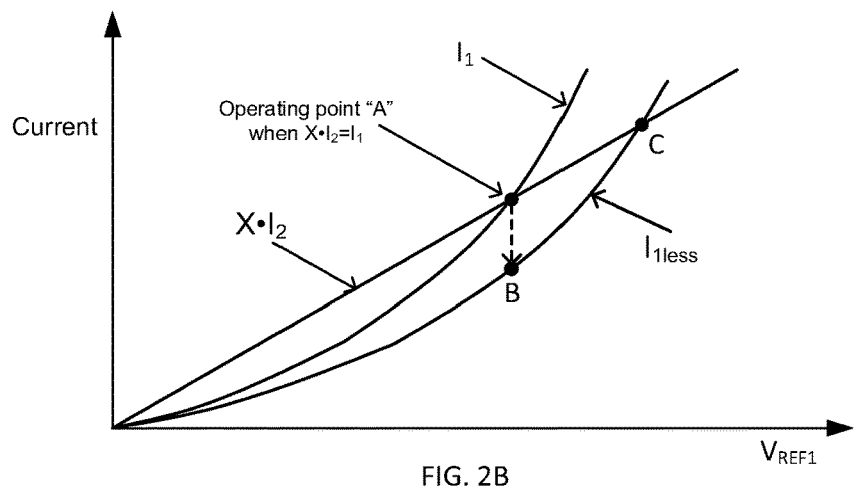
FIG. 2B illustrates a graph of an example current/voltage responses for an example control circuit and ring oscillator of the signal delay circuit of FIG. 2A in accordance with another aspect of the disclosure.

FIG. 2B illustrates a graph of an example intrinsic current versus voltage responses for the control circuit 210 and the ring oscillator 220 of the signal delay circuit 200 in accordance with another aspect of the disclosure. The horizontal axis of the graph represents the reference voltage $V_{REF1}$ (at node $n_1$) provided to the ring oscillator 220. The vertical axis represents current with respect to the intrinsic current/voltage response (labeled as "$X \cdot I_2$") of the control circuit 210, and with respect to the intrinsic current/voltage responses (labeled "$I_1$" and "$I_{1less}$") of the ring oscillator 220 for two different configurations, as discussed further herein.

The intrinsic current/voltage response $X \cdot I_2$ of the control circuit 210 is the response of the current $I_1$ with variation in the reference voltage $V_{REF1}$ with the ring oscillator 220 disconnected from node $n_1$. Similarly, the intrinsic current/voltage responses $I_1$ and $I_{1less}$ of the ring oscillator 220 is the response of the ring oscillator 220 current with variation in the reference voltage $V_{REF1}$ with the control circuit 210 disconnected from node $n_1$.

As discussed in more detail herein, the control circuit 210 adjusts the operating point (e.g., $V_{REF1}$ and $I_1$) of the ring oscillator 220 to be on the linear $X \cdot I_2$ response. When this occurs, the following relationships hold true:

$$\frac{V_{REF1}}{I_1} = \frac{R}{X} \qquad \text{Eq. 1}$$

$$\frac{V_{REF1}}{I_2} = R \qquad \text{Eq. 2}$$

$$V_{n3} = V_{REF1} \qquad \text{Eq. 3}$$

where R is the resistance of the resistive device R, and $V_{n3}$ is the voltage at node $n_3$. In this example, the ring oscillator 220 is initially operating at point "A" on the $X \cdot I_2$ line. Also, the initial operating point "A" is on the intrinsic current versus reference voltage $V_{REF1}$ non-linear response "$I_1$" (because the ring oscillator 220 is drawing $I_1$ current).

Then, according to this example, the delay controller 230 tunes (increases) the reference voltage $V_{REF1}$ by generating the delay control signal (DCS) to enable less inverters in the ring oscillator 220. As a result, the intrinsic current versus reference voltage $V_{REF1}$ response of the ring oscillator 220 changes to the non-linear response "$I_{1less}$", where $I_{1less} < I_1$. As illustrated, the intrinsic current versus reference voltage $V_{REF1}$ response $I_{1less}$ is lower in current than the intrinsic current versus reference voltage $V_{REF1}$ response Thus, when less inverters are enabled in the ring oscillator 220 by the DCS, the operating point initially changes to point "B", where the current drawn by the ring oscillator 220 is less than the current drawn when operating at point "A"; but the reference voltage $V_{REF1}$ initially remains the same. As a result, the intrinsic conductivity of the ring oscillator 220 decreases.

In response to the intrinsic conductivity of the ring oscillator 220, the reference voltage $V_{REF1}$ increases due to the control circuit 210 supplying the current $I_1$ and charging node $n_1$. The operational amplifier 212 of the control circuit 210, sensing now a voltage difference between the voltage $V_{n3}$ and the reference voltage $V_{REF1}$, decreases the sense voltage $V_{SNS}$ applied to the gates of the PMOS FETs $M_1$ and $M_2$. This causes the currents $I_1$ and $I_2$ to increase. In response, the voltage $V_{n3}$ begins to rise at a faster rate than the reference voltage $V_{REF1}$. When the voltage $V_{n3}$ is substantially equal to the reference voltage $V_{REF1}$ (e.g., Eq. 3 is satisfied), the ring oscillator 220 is operating at point "C", which is on the linear $X \cdot I_2$ response. Thus, the control circuit 210 responds to changes in the ring oscillator 220 to bring its operating point on the linear $X \cdot I_2$ response.

Figure 2C:
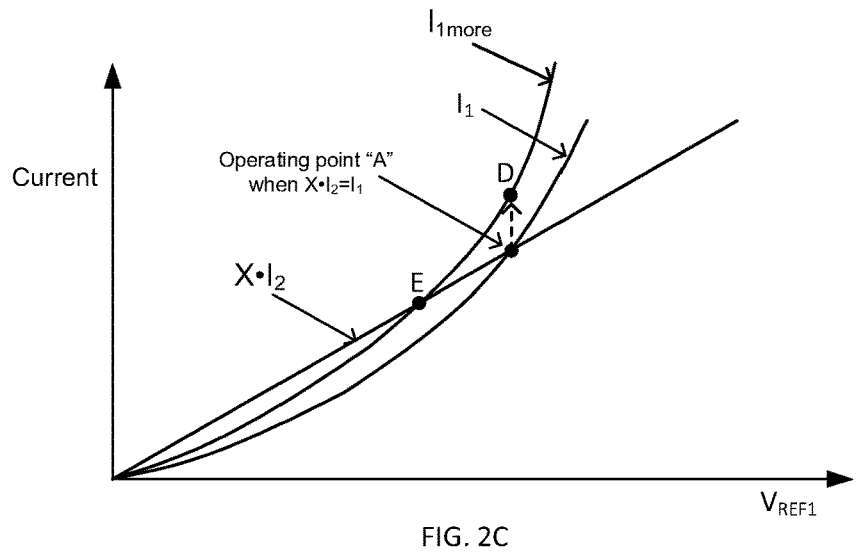
FIG. 2C illustrates a graph of another example current/voltage for an example control circuit and ring oscillator of the signal delay circuit of FIG. 2A in accordance with another aspect of the disclosure.

FIG. 2C illustrates a graph of an example intrinsic current versus voltage for the control circuit 210 and the ring oscillator 220 of the signal delay circuit 200 in accordance with another aspect of the disclosure. The horizontal axis of the graph represents the reference voltage $V_{REF1}$ (at node $n_1$) provided to the ring oscillator 220. The vertical axis represents current with respect to the intrinsic current/voltage response (labeled as "$X \cdot I_2$") of the control circuit 210, and with respect to the intrinsic current/voltage responses (labeled "$I_1$" and "$I_{1more}$") of the ring oscillator 220 for two different configurations, as discussed further herein.

Similarly, in this example, the ring oscillator 220 is initially operating at point "A" on the $X \cdot I_2$ line. Also, the initial operating point "A" is on the intrinsic current versus reference voltage $V_{REF1}$ non-linear response "$I_1$" (because the ring oscillator 220 is drawing $I_1$ current). Then, according to this example, the delay controller 230 tunes the reference voltage $V_{REF1}$ by generating the delay control signal (DCS) to enable more inverters in the ring oscillator 220. As a result, the intrinsic current versus reference voltage $V_{REF1}$ for the ring oscillator 220 changes to a non-linear response "$I_{1more}$", where $I_{1more} > I_1$. As illustrated, the intrinsic current versus reference voltage $V_{REF1}$ response $I_{1more}$ is higher in current than the intrinsic current versus reference voltage $V_{REF1}$ response h. Thus, when more inverters are enabled in the ring oscillator 220 by the DCS, the operating point initially changes to point "D", where the current drawn by the ring oscillator 220 is more than the current drawn when operating at point "A"; but the reference voltage $V_{REF1}$ initially remains the same. As a result, the intrinsic conductivity of the ring oscillator 220 increases.

Figure 2D:
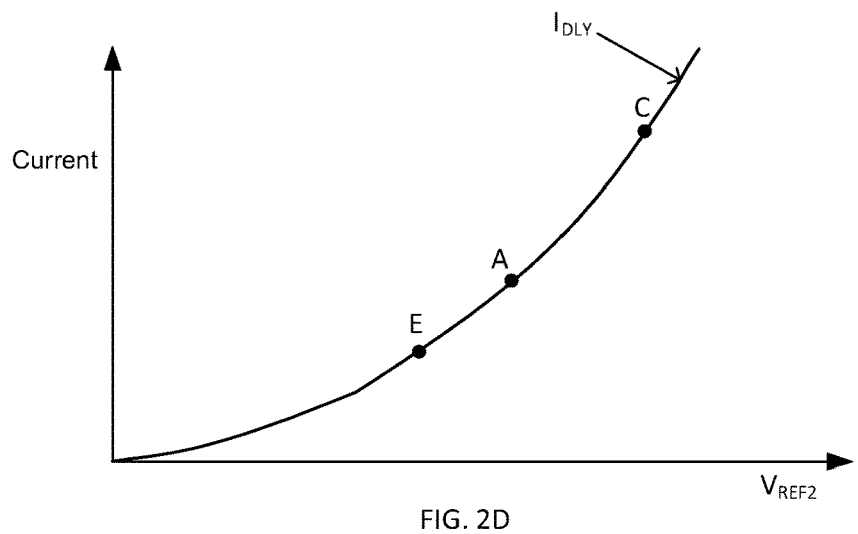
FIG. 2D illustrates a graph of an example current/voltage response for an example delay line of FIG. 2A in accordance with another aspect of the disclosure.

In response to the increased intrinsic conductivity of the ring oscillator 220, the reference voltage $V_{REF1}$ decreases due to the control circuit 210 supplying the current $I_1$ to the ring oscillator 220. The operational amplifier 212 of the control circuit 210, sensing now a voltage difference between the voltage $V_{n3}$ and the reference voltage $V_{REF1}$, increases the sense voltage $V_{SNS}$ applied to the gates of the PMOS FETs $M_1$ and $M_2$. This causes the currents $I_1$ and $I_2$ to decrease. In response, the voltage $V_{n3}$ begins to fall at a faster rate than the reference voltage $V_{REF1}$ When the voltage $V_{n3}$ is substantially equal to the reference voltage $V_{REF1}$ (e.g., Eq. 3 is satisfied), the ring oscillator 220 is operating at point "E", which is on the linear $X \cdot I_2$ response. Thus, the control circuit 210 responds to changes in the ring oscillator 220 to bring the operating point on the linear $X \cdot I_2$ response. FIG. 2D illustrates a graph of an example intrinsic current/voltage response for the delay line 250 of the signal delay circuit 200 in accordance with another aspect of the disclosure. The horizontal axis of the graph represents the reference voltage $V_{REF2}$ (at node $n_2$) provided to the delay line 250. The vertical axis represents current drawn by the delay line 250. The previous examples discussed with reference to FIGS. 2B-2C are discussed below with the example current/voltage response for the delay line 250 in the graph depicted in FIG. 2D.

The control of the delay line 250 may be as follows: As discussed, the delay control signal (DCS) generated by the delay controller 230 sets the number of enabled inverters in the ring oscillator 220, which is related to the current $I_1$ drawn by the ring oscillator 220. With reference to the examples of FIG. 2B-2C, the initial number of inverters enabled by the DCS sets the operating point of the ring oscillator to point "A". Since $V_{REF2}$ is substantially equal to $V_{REF1}$, the corresponding operating point "A" is plotted on the intrinsic current/voltage response of the delay line 250.

As discussed with the example of FIG. 2B, if the number of enabled inverters decreases, the reference voltage $V_{REF1}$ increases. In response, the voltage regulator 240 increases the reference voltage $V_{REF2}$. Accordingly, the delay line 250 is now operating at point "C" along its intrinsic current/voltage response $I_{DLY}$. As a result of the higher reference voltage $V_{REF2}$, the delay line 250 decreases the delay imparted to the input signal $S_{IN}$. Similarly, as discussed with the example of FIG. 2C, if the number of enabled inverters increases, the reference voltage $V_{REF1}$ decreases. In response, the voltage regulator 240 decreases the reference voltage $V_{REF2}$. Accordingly, the delay line 250 is now operating at point "E" along its intrinsic current/voltage response $I_{DLY}$. As a result of the lower reference voltage $V_{REF2}$, the delay line 250 increases the delay imparted to the input signal $S_{IN}$.

Mathematically, the period $T_{OSC}$ of the oscillating signal generated by the ring oscillator 220 may be determined by the following equation:

$$T_{OSC} = C_R \cdot V_{REF1}/I_1 \qquad \text{Eq. 4}$$

where $C_R$ is the capacitance of each of the capacitors $C_{11}$ to Cm. However, according to Eq. 1, $V_{REF1}/I_1$ is equal to R/X. The resistance R of the resistive device R and the current ratio X of the current mirror $M_1/M_2$ may be configured to be substantially constant over PVT variations. Thus, the period $T_{OSC}$ of the oscillating signal of the ring oscillator 220 may be given by the following equation:

$$T_{OSC} = C_R \cdot R/X \qquad \text{Eq. 5}$$

Thus, if $C_R$, R, and X may be configured as substantially constants, then the period $T_{OSC}$ of the ring oscillator 220 is also substantially constant. Accordingly, this attribute improves the PVT robustness of the period $T_{OSC}$. As discussed below, the delay $T_{DLY}$ imparted to the input signal $S_{IN}$ by the delay line 250 is related to the period $T_{OSC}$ of the ring oscillator 220. Thus, by extension, the delay $T_{DLY}$ is also more PVT robust.

As Eq. 5 shows, the period $T_{OSC}$ of the oscillating signal generated by the ring oscillator 220 is a function of an R*C time constant, namely $C_R*R$. As the delay imparted to the input signal $S_{IN}$ by the delay line 250 is related to the period $T_{OSC}$, which is related to an R*C time constant, the PVT variation of the delay imparted by delay line 250 may be controlled by properly designing of the resistive device R and the capacitors $C_{11}$ to Cm. As an example, if a switched capacitor resistor is used as the resistive device R, as discussed further herein, the delay $T_{DLY}$ may be a function of a capacitor ratio $C_R/C_{SW}$, where $C_{SW}$ is the capacitor of the switched capacitor resistor. The resistive device R may also be configured as a thin-film resistor, which may be temperature-compensated to reduce delay dependency on PVT variation. The delay $T_{DLY}$ imparted to the input signal $S_{IN}$ by the delay line 250 may be given by the following relationship:

$$T_{DLY} = C_L V_{REF2}/I_{DLY} \qquad \text{Eq. 6}$$

where $C_L$ is the capacitance of each of the capacitors $C_{12}$ to $C_{M2}$ of the delay line 250, and $I_{DLY}$ is the current drawn by the delay line 250.

Due to the voltage regulator 240, the reference voltage $V_{REF2}$ is substantially equal to the reference voltage $V_{REF1}$. The current $I_{DLY}$ drawn by the delay line 250 may be given by the following relationship:

$$I_{DLY} = I_1 \cdot Q/\overline{P} \qquad \text{Eq. 7}$$

where Q is the number of parallel inverters per inverter stage in the delay line 250, and $\overline{P}$ is the average number of enabled parallel inverters per stage in the ring oscillator 220. Substituting Eq. 7 for $I_{DLY}$ in Eq. 6, the delay $T_{DLY}$ imparted to the input signal $S_{IN}$ by the delay line 250 may be given by the following relationship:

$$T_{DLY} = C_L \cdot V_{REF1}/I_1 \cdot \overline{P}/Q \qquad \text{Eq. 8}$$

As the capacitance $C_L$ of the capacitors $C_{12}$ to $C_{M2}$ may be controlled to be substantially constant with PVT variation, and as previously discussed, $V_{REF1}/I_1$ is equal to R/X, which also may be controlled to be substantially constant with PVT variation, and P/Q is simply a constant number when P is set, the PVT robustness may also be achieved for the delay $T_{DLY}$.

Moreover, the average number of enabled inverters P may be given by the following equation:

$$\overline{P} = [A \cdot P + B \cdot (P+1)]/N \qquad \text{Eq. 9}$$

Where A is the number of inverter stages in the ring oscillator 220 with P enabled inverters, B is the number of inverter stages in the ring oscillator 220 with P+1 enabled inverters, and N is the number of cascaded stages of the ring oscillator 220 (A+B=N). [A P+B (P+1)] may be controlled by DCS signal from delay controller 230. Thus, by changing DCS by one, a linear delay $T_{DLY}$ versus DCS transfer function and a high resolution $\Delta T_{DLY}$ per one enabled inverter for the delay $T_{DLY}$ may be achieved (e.g., $C_L \cdot V_{REF1}/I_1 \cdot 1/(N \cdot Q)$ resolution by substituting P for 1/N in Eq. 8).

Figure 3:
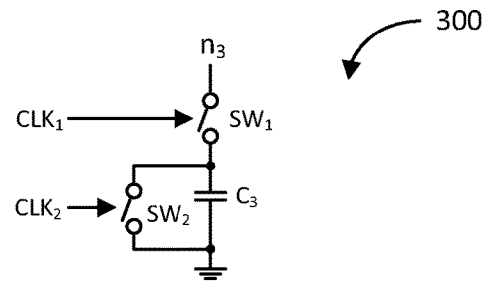
FIG. 3 illustrates a schematic diagram of an example switched capacitor resistor in accordance with another aspect of the disclosure.

FIG. 3 illustrate a schematic diagram of an example switched capacitor resistor 300 in accordance with another aspect of the disclosure. As previously mentioned, the resistive device R of the signal delay circuit 200 may be implemented as a switched capacitor resistor 300.

In particular, the switched capacitor resistor 300 includes a first switching device $SW_1$, a capacitor $C_3$, and a second switching device $SW_2$. The first switching device $SW_1$ and the capacitor $C_3$ are coupled in series between the node $n_3$ and the lower voltage rail (e.g., ground). The second switching device $SW_2$ is coupled in parallel with the capacitor $C_3$. The open/closed states of the first switching device $SW_1$ is controlled by a first clock signal $CLK_1$, and the open/closed states of the second switching device $SW_2$ is controlled by a second clock signal $CLK_2$. In an exemplary implementation, the first and second clock signals $CLK_1$ and $CLK_2$ may be based on the input signal $S_{IN}$ to the delay line 250.

In operation, during a first phase of the switching operation of the first and second switching devices $SW_1$ and $SW_2$, the first switching device $SW_1$ is closed and the second switching device $SW_2$ is open. Accordingly, in this phase, the current $I_2$ is charging the capacitor $C_3$. During a second phase of the switching operation of the first and second switching devices $SW_1$ and $SW_2$, the first switching device $SW_1$ is open and the second switching device $SW_2$ is closed. Accordingly, in this phase, the charges stored in the capacitor $C_3$ during the first phase flows to the lower voltage rail (e.g., ground) via the second switching device $SW_2$. By alternating the open/closed states of the first and second switching devices $SW_1$ and $SW_2$ at a frequency f, the switched capacitor resistor 300 has a resistance R given by the following relationship: $R=1/(C_{SW}*f)$, where $C_{SW}$ is the capacitance of capacitor $C_3$.

Figure 4:
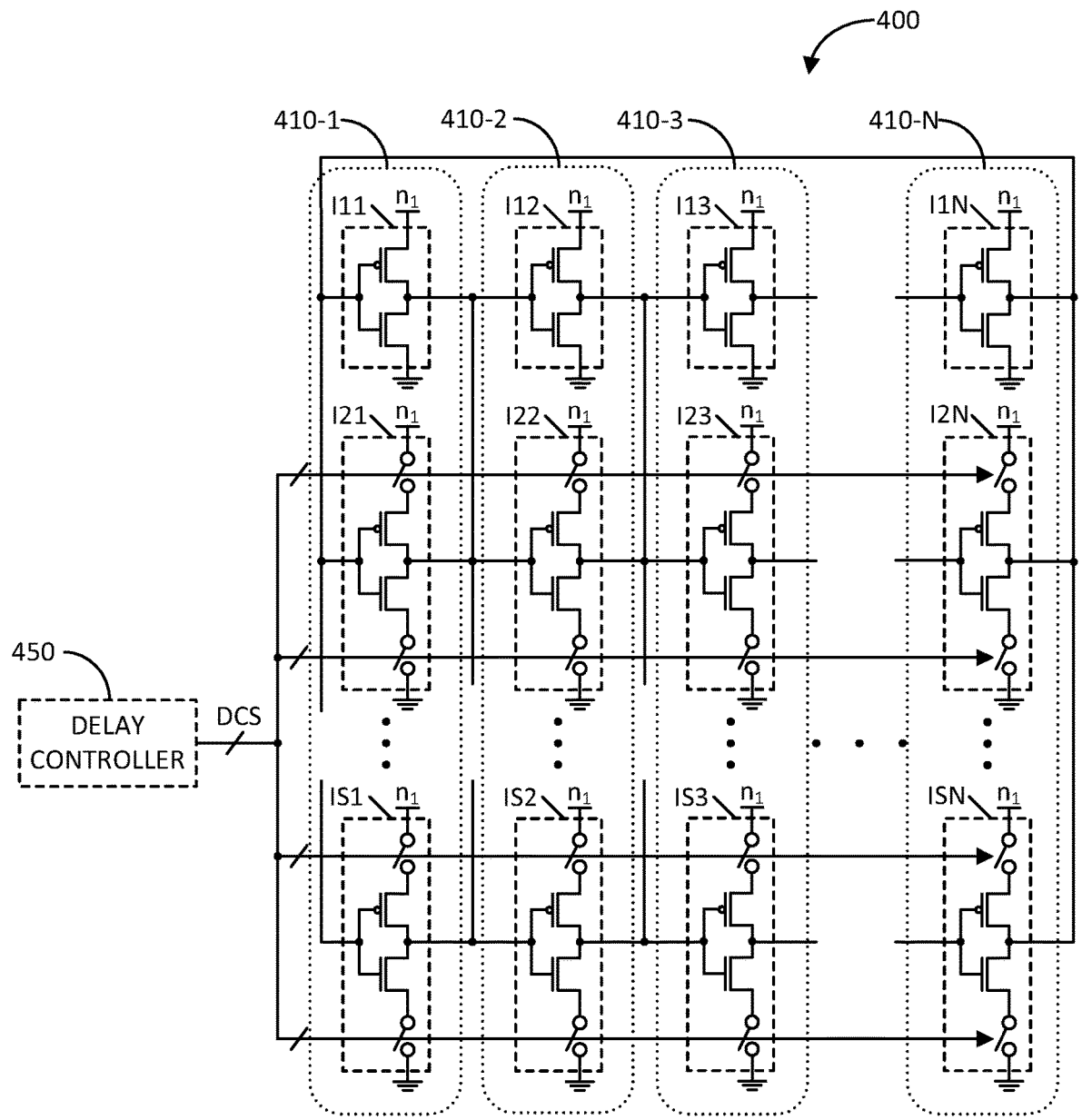
FIG. 4 illustrates a schematic diagram of an example ring oscillator in accordance with another aspect of the disclosure.

FIG. 4 illustrates a schematic diagram of an example ring oscillator 400 in accordance with another aspect of the disclosure. The ring oscillator 400 may be an example of a more detailed implementation of the ring oscillator 220 previously discussed.

The ring oscillator 400 includes a set of N inverter stages 410-1 to 410-N. Each inverter stage includes a set of parallel inverters. For example, the first inverter stage 410-1 includes a first set of parallel inverters I11 to IS1; the second inverter stage 410-2 includes a second set of parallel inverters 112 to IS2; the third inverter stage 410-3 includes a third set of parallel inverters 113 to IS3; and so on, to the Nth inverter stage 410-N including an Nth set of parallel inverters UN to ISN, where N is an odd integer as previously discussed, and S is an integer. Thus, in this example, there are SxN inverters. The inputs of the parallel inverters of each stage are coupled together, and to coupled-together outputs of the parallel inverters of the previous inverter stage (including the input of the first inverter stage 410-1 coupled to the output of the last inverter stage 410-N). Similarly, the outputs of the parallel inverters of each stage are coupled together, and to the coupled-together inputs of the parallel inverters of the following inverter stage (including the output of the last inverter stage 410-N coupled to the input of the first inverter stage 410-1).

In this example, some of the inverters may be always on or enabled. The always-enabled inverters are the inverters I11 to I1N. That is, at least one row of inverters may include always-enabled inverters so that the ring oscillator 400 oscillates without the involvement of a delay controller 450. Other inverters may be selectively-enabled inverters. In this example, the selectively-enabled inverters are inverters 121 to ISN. Each of the selectively-enabled inverters include a first switching device coupled between node $n_1$ and the inverter PMOS FET, and a second switching device coupled between the inverter NMOS FET and the lower voltage rail (e.g., ground). The delay controller 450 is coupled to control inputs of the first and second switching devices of each of the selectively-enabled inverters to control the open/closed states of the switching devices via the delay control signal (DCS).

Figure 5:
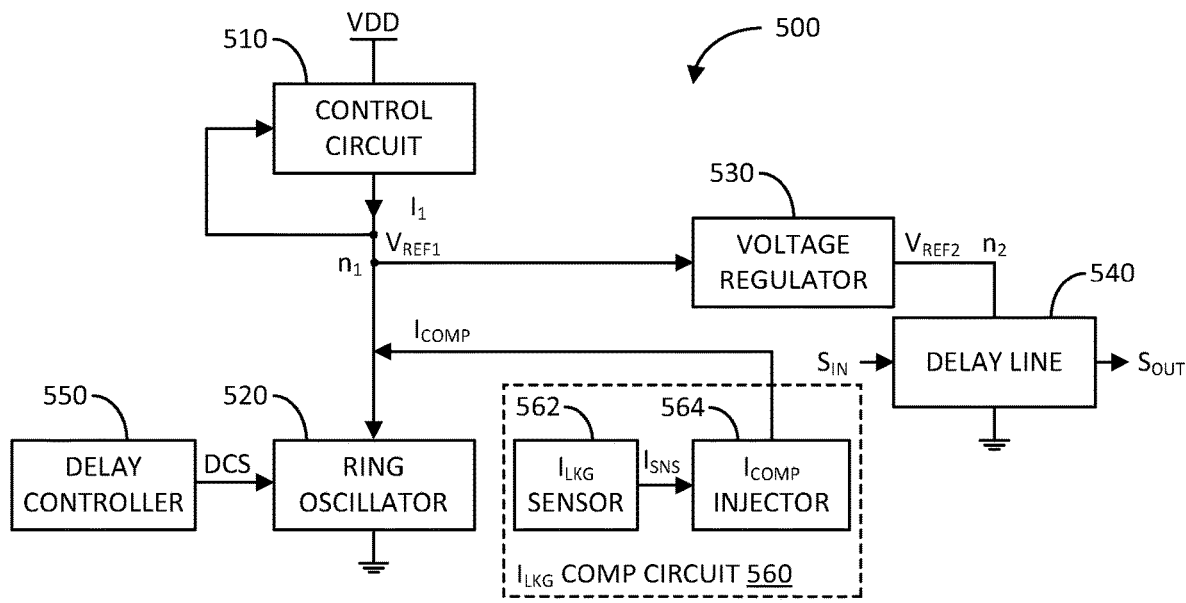
FIG. 5 illustrates a block diagram of another example signal delay circuit in accordance with another aspect of the disclosure.

FIG. 5 illustrates a block diagram of another example signal delay circuit 500 in accordance with another aspect of the disclosure. The signal delay circuit 500 is similar to signal delay circuit 100 previously discussed, and includes many similar elements identified with the same reference numbers with the exception that the most significant digit is a "5" in signal delay circuit 500 as compared to a "1" in signal delay circuit 100.

The signal delay circuit 500 differs from signal delay circuit 100 in that signal delay circuit 500 further includes a leakage current $I_{LKG}$ compensation circuit 560 configured to inject a compensation current $I_{COMP}$ into the ring oscillator 520 to compensate for current leakage in the ring oscillator 520. In particular, in certain technology nodes (e.g., 7 nanometer (nm) FIN FETs and more or different advanced tech node) and relatively high temperature, the ring oscillator 520 may experience significant current leakage.

To compensate the ring oscillator 520 for the current leakage, the leakage current $I_{LKG}$ compensation circuit 560 includes a leakage current $I_{LKG}$ sensor 562 and a compensation current $I_{COMP}$ injector 564. The leakage current $I_{LKG}$ sensor 562 is configured to generate a sensed current Isms related to (e.g., proportional to an estimate of) the leakage current $I_{LKG}$ occurring in the ring oscillator 520. The compensation current $I_{COMP}$ injector 564 is configured to generate and inject a compensation current $I_{COMP}$ into the ring oscillator 520 based on the sensed current Isms. The compensation current $I_{COMP}$ should be substantially the same as or within a defined tolerance of the leakage current $I_{LKG}$ occurring in the ring oscillator 520.

Figure 6:
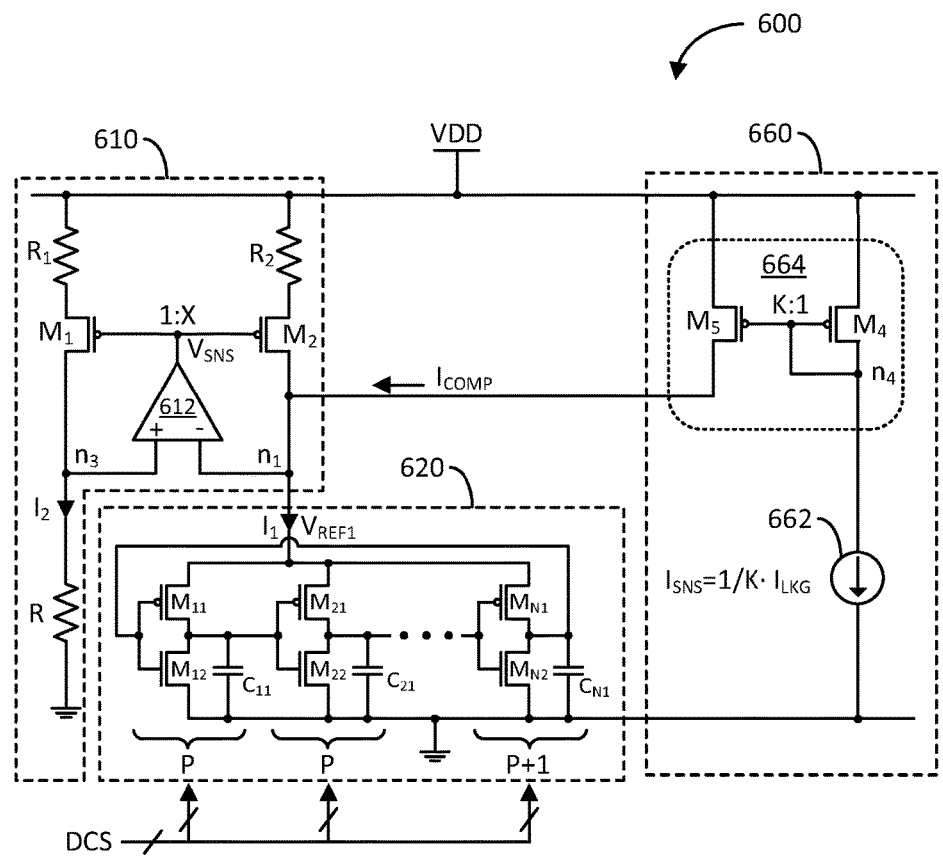
FIG. 6 illustrates a schematic diagram of a portion of another example signal delay circuit in accordance with another aspect of the disclosure.

FIG. 6 illustrates a schematic diagram of a portion of another example signal delay circuit 600 in accordance with another aspect of the disclosure. The signal delay circuit 600 may be an example more detailed implementation of a portion of the signal delay circuit 200 previously discussed, with the addition of a leakage current $I_{LKG}$ compensation circuit. The portion common to both the signal delay circuits 600 and 200 are the ring oscillator 620 and the control circuit 610 including the operational amplifier 612. It shall be understood that the signal delay circuit 600 may also include a delay controller, voltage regulator, and delay line, as in signal delay circuit 200.

As mentioned, the signal delay circuit 600 includes a leakage current $I_{LKG}$ compensation circuit 660. The leakage current $I_{LKG}$ compensation circuit 660 includes a leakage current sensor 662 and a compensation current $I_{COMP}$ injector 664 in the form of a current mirror. The leakage current $I_{LKG}$ sensor 662 is represented as a current source configured to generate a sensed current Isms being a scaled down (1/K) version of an estimate leakage current $I_{LKG}$ occurring in the ring oscillator 620, where 1/K is the scaling factor.

The compensation current $I_{COMP}$ injector 664 includes a PMOS FET $M_4$ coupled in series with the leakage current $I_{LKG}$ sensor 662 between the upper voltage rail VDD and the lower voltage rail (e.g., ground). The compensation current $I_{COMP}$ injector 664 includes a PMOS FET $M_5$ coupled between the upper voltage rail VDD and node $n_1$. The gates of the PMOS FETs $M_5$ and $M_4$ are coupled together and to the drain of PMOS FET $M_4$ to form a current mirror. The sizes of the PMOS FETs $M_5$ and $M_4$ may be configured to provide a current mirror ratio K to compensate for the scaled version of the estimate leakage current in the sensed current Isms. Thus, the compensation current $I_{COMP}$ injector 664 is configured to generate a compensation current $I_{COMP}$ which is K times the sensed current Isms. The compensation current $I_{COMP}$ is provided to the ring oscillator 620 via node $n_1$.

Figure 7:
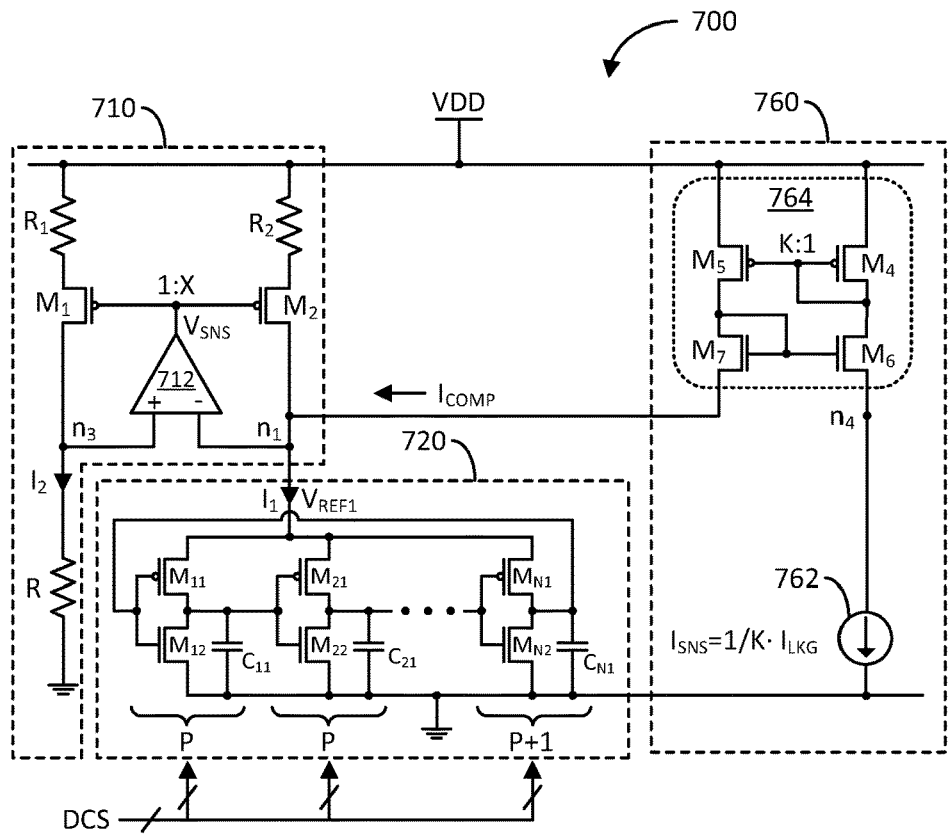
FIG. 7 illustrates a schematic diagram of a portion of another example signal delay circuit in accordance with another aspect of the disclosure.

FIG. 7 illustrates a schematic diagram of a portion of another example signal delay circuit 700 in accordance with another aspect of the disclosure. The signal delay circuit 700 is a variation of the signal delay circuit 600 with many of the same elements as identified by the same reference numbers except the most significant digit is a "7" in the case of signal delay circuit 700. The signal delay circuit 700 differs from signal delay circuit 800 in that the compensation current $I_{COMP}$ injector 764 further includes a current input error amplifier to force the voltages at nodes $n_1$ and $n_4$ to be substantially the same or within a certain percent difference (e.g., 20 percent) (i.e., to be related to each other). In other words, the current input error amplifier is configured to control a first voltage across the leakage current sensor 762 to be related to a second voltage at the first node $n_1$. In fast corners, the difference in the voltages at nodes $n_1$ and $n_4$ may cause a difference between the compensation current $I_{COMP}$ and the sensed leakage current occurring in the ring oscillator 720. Additionally, the current input error amplifier improves the power supply rejection ratio (PSRR) and suppresses power supply variation from affecting the compensation current $I_{COMP}$. In this example, the current input error amplifier includes NMOS FETs $M_7$ and $M_6$ coupled between PMOS FETs $M_5$ and $M_4$ and nodes $n_1$ and $n_4$, respectively. The gates of the NMOS FETs $M_7$ and $M_6$ are coupled to the drain of the NMOS FET $M_7$.

Figure 8:
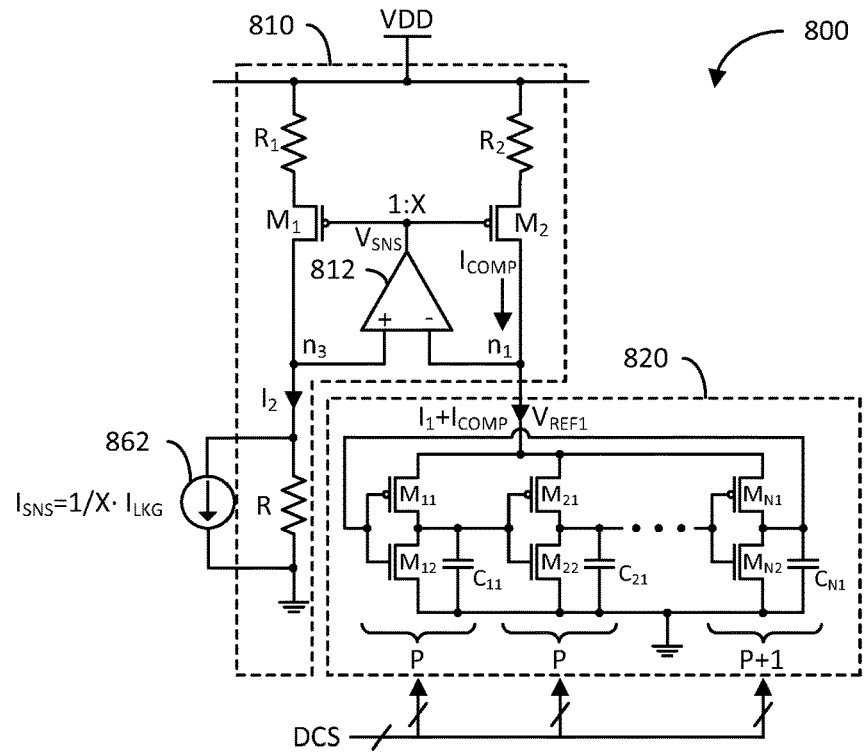
FIG. 8 illustrates a schematic diagram of another portion of another example signal delay circuit in accordance with another aspect of the disclosure.

FIG. 8 illustrates a schematic diagram of a portion of another example signal delay circuit 800 in accordance with another aspect of the disclosure. The signal delay circuit 800 may be an example more detailed implementation of a portion of the signal delay circuit 200 previously discussed, with the addition of a leakage current $I_{LKG}$ compensation circuit. The portion common to both the signal delay circuits 800 and 200 are the ring oscillator 820 and the control circuit 810 including the operational amplifier 812. It shall be understood that the signal delay circuit 800 may also include a delay controller, voltage regulator, and delay line, as in signal delay circuit 200.

As mentioned, the signal delay circuit 800 includes a leakage current $I_{LKG}$ compensation circuit 862 including a leakage current sensor (e.g., represented as a current source) coupled in parallel with the resistive device R of the control circuit 810. The leakage current sensor 862 is configured to generate a sensed current $I_{SNS}$ being substantially equal to 1/X multiplied by the estimated leakage current $I_{LKG}$ occurring in the ring oscillator 820, where X is the current ratio of the current mirror formed by PMOS FETs $M_1$ and $M_2$, as previously discussed. Thus, the current mirror amplifies the sensed current $I_{SNS}$ by the current ratio X to generate a compensation current $I_{COMP}$, which is substantially equal to (e.g., within a defined tolerance of) the estimate of the leakage current $I_{LKG}$ occurring in the ring oscillator 820. The compensation current $I_{COMP}$ flows into the ring oscillator 820 to compensate for the leakage current $I_{LKG}$. Thus, in this implementation, the compensation current $I_{COMP}$ is provided to the ring oscillator 820 via the control circuit 810.

Figure 9:
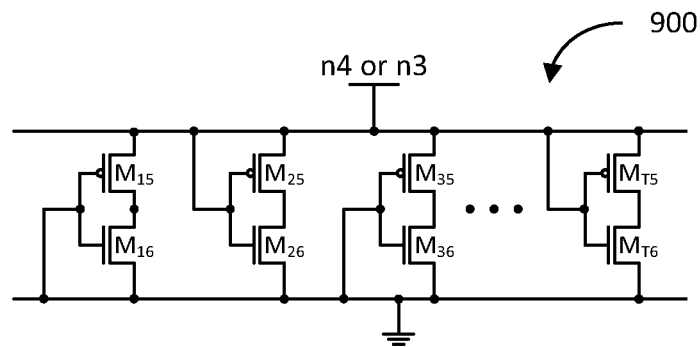
FIG. 9 illustrates a schematic diagram of an example leakage current sensor in accordance with another aspect of the disclosure.

FIG. 9 illustrates a schematic diagram of an example leakage current sensor 900 in accordance with another aspect of the disclosure. The leakage current sensor 900 may be an example more detailed implementation of any one of the leakage current sensors 662, 762, and 862. The leakage current sensor 900 includes a set of dummy (non-operational) inverters $M_{15}/M_{16}$ to $M_{T5}/M_{T6}$. The inverters are dummy or non-operational as their inputs (gates) are tied to either node $n_4$ as in signal delay circuits 600 and 700 or node $n_3$ as in signal delay circuit 800 or the lower voltage rail (e.g., ground). As an example, substantially half of the inverters may have their inputs tied to the lower voltage rail (e.g., ground), and substantially the other half may have their inputs tied to node $n_4$ or $n_3$.

The number of inverters in the leakage current sensor 900 should be around a scaled factor (e.g., 1/K or 1/X) of the number of enabled inverters in the corresponding ring oscillator. As the number of enabled inverters in the corresponding ring oscillator may vary depending on the desired delay for the delay line, the number of inverters in the leakage current sensor 900 may be set to the mean or middle value of the number of enabled inverters in the corresponding ring oscillator. The current drawn by the leakage current sensor 900 is the sensed current Isms previously discussed.

Figure 10:
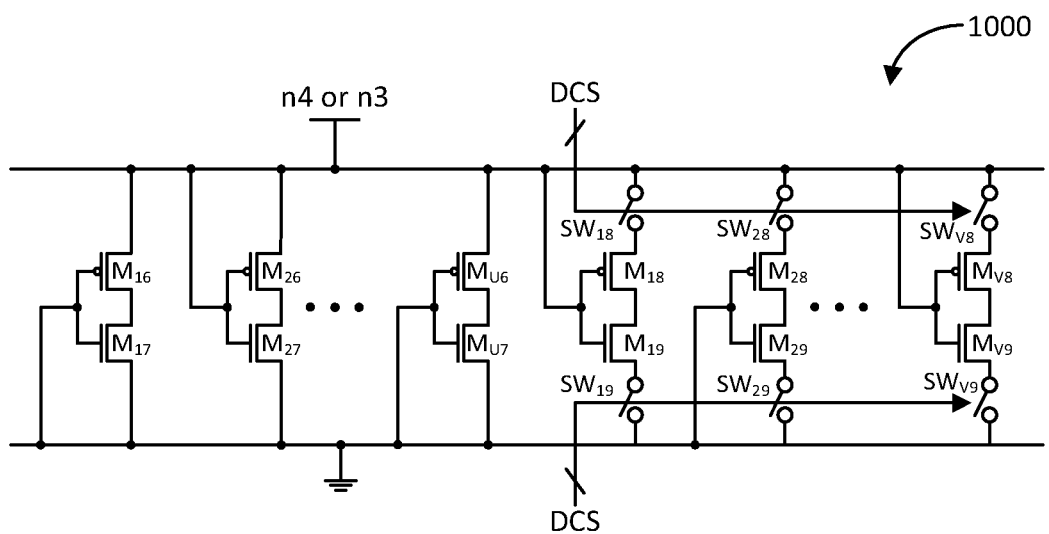
FIG. 10 illustrates a schematic diagram of another example leakage current sensor in accordance with another aspect of the disclosure.

FIG. 10 illustrates a schematic diagram of another example leakage current sensor 1000 in accordance with another aspect of the disclosure. The leakage current sensor 1000 may be an example of a more detailed implementation of any one of the leakage current sensors 662, 762, and 862. The leakage current sensor 1000 includes a set of always-enabled dummy (non-operational) inverters $M_{16}/M_{17}$ to $M_{U6}/M_{U7}$, and a set of selectively-enabled dummy (non-operational) inverters $M_{18}/M_{19}$ to $M_{V8}/M_{V9}$ The set of selectively-enabled dummy (non-operational) inverters $M_{18}/M_{19}$ to $M_{V8}/M_{V9}$ further include switching devices $SW_{18}/SW_{19}$ to $SW_{V8}/SW_{V9}$, which may be controlled by the delay control signal (DCS) generated by a corresponding delay controller. That is, the delay controller, via the delay control signal (DCS) enables the number of selectively-enabled inverters in the leakage current sensor 1000 to be substantially a scaled factor (e.g., 1/K or 1/X) of the number of enabled inverters in the corresponding ring oscillator. The current drawn by the leakage current sensor 1000 is the sensed current Isms previously discussed.

Figure 11:
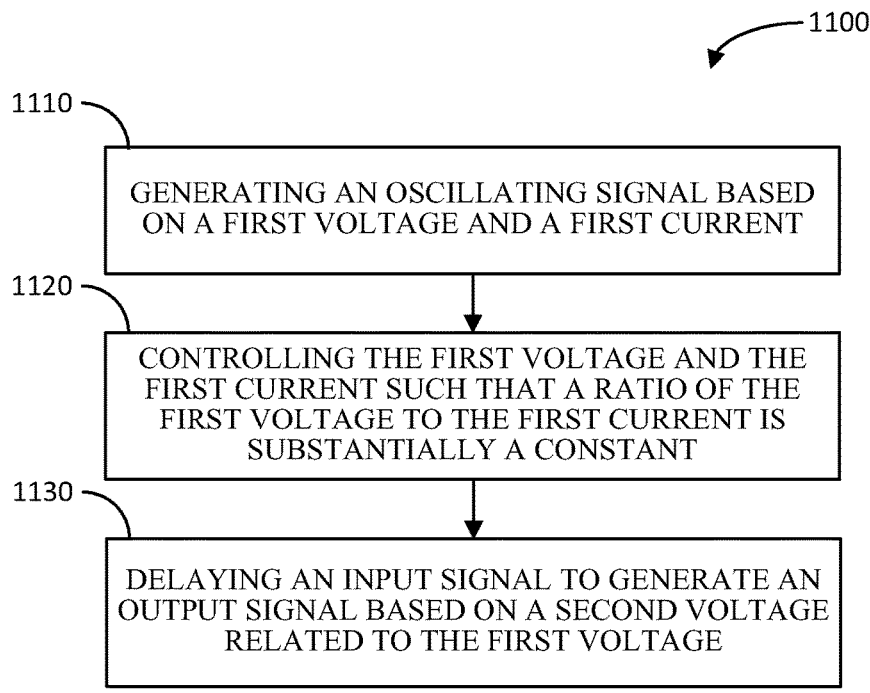
FIG. 11 illustrates a flow diagram of an example method of delaying a signal in accordance with another aspect of the disclosure.

FIG. 11 illustrates a flow diagram of an example method 1100 of delaying a signal in accordance with another aspect of the disclosure. The method 1100 includes generating an oscillating signal based on a first voltage and a first current (block 1110). Examples of means for generating an oscillating signal based on a first voltage and a first current include any of the ring oscillators described herein.

The method 1100 further includes controlling the first voltage and the first current such that a ratio of the first voltage to the first current is substantially a constant (block 1120). Examples of means for controlling the first voltage and the first current such that a ratio of the first voltage to the first current is substantially a constant include any of the control circuits described herein.

Additionally, the method 1100 includes delaying an input signal to generate an output signal based on a second voltage related to the first voltage (block 1130). Examples of means for delaying an input signal to generate an output signal based on a second voltage related to the first voltage include any of the delay lines described herein.

The controlling of the first voltage and the first current may include generating a second current related to the first current, routing the second current through a resistive device to generate a third voltage, and controlling the first and second currents based on a difference between the third voltage and the first voltage, wherein the first voltage is based on the first current. Examples of means for generating a second current related to the first current include any of the current mirrors including the PMOS FETs $M_1$ and $M_2$. Examples of means for routing the second current through a resistive device to generate a third voltage include any of the coupling of the current mirror to the resistive device R. Examples of means for controlling the first and second currents based on a difference between the third voltage and the first voltage include any of the operational amplifiers 212, 812, 912, and 1012.

The method may further includes tuning the first voltage including selectively enabling one or more parallel inverters of a ring of cascaded parallel inverters. Examples of means for enabling one or more parallel inverters of a ring of cascaded parallel inverters include any of the delay controllers described herein. The method may further include sensing a leakage current in the ring oscillator and providing a compensation current to the ring oscillator based on the sensed leakage current. Examples of means for sensing a leakage current in the ring oscillator include any of the leakage current sensors described herein. Examples of means for providing a compensation current to the ring oscillator based on the sensed leakage current include any of the compensation current $I_{COMP}$ injectors described herein. The providing of the compensation current to the ring oscillator may include providing the compensation current to the ring oscillator via a control circuit for controlling the first voltage. Examples of means for providing a compensation current to the ring oscillator via a control circuit may include the coupling of the leakage current sensor 862 to the control circuit described herein.

Figure 12:
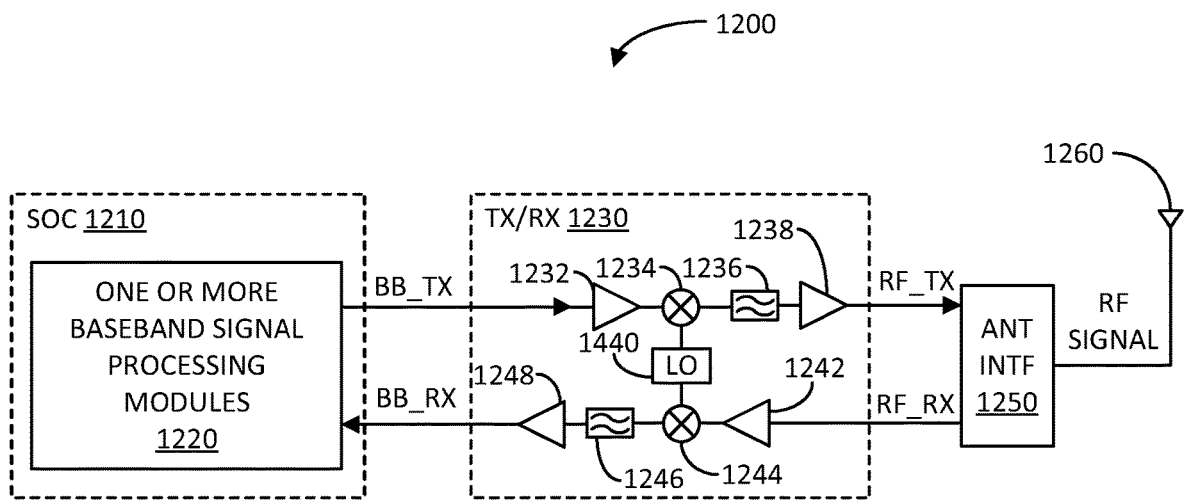
FIG. 12 illustrates a block diagram of an example wireless communication device in accordance with another aspect of the disclosure.

FIG. 12 illustrates a block diagram of an example wireless communication device 1200 in accordance with another aspect of the disclosure. The wireless communication device 1200 includes an integrated circuit (IC) 1210, which may be implemented as a system on chip (SOC). The SOC 1210 includes one or more baseband signal processing modules 1220.

The wireless communication device 1200 further includes a transceiver (Tx/Rx) 1230 coupled to the one or more baseband signal processing modules 1220 to receive a baseband transmit signal BB_TX therefrom, and provide a baseband receive signal BB_RX thereto. The transceiver (Tx/Rx) 1230 may include a baseband amplifier 1232, an up-converting mixer 1234, a radio frequency (RF) filter 1236, and a power amplifier 1238. These devices 1232, 1234, 1236, and 1238 cascaded together, with the mixer 1234 coupled to a local oscillator (LO) 1240, are configured to convert the baseband transmit signal BB_TX into an RF transmit signal RF_TX. The transceiver (Tx/Rx) 1230 further includes a low noise amplifier (LNA) 1242, a down-converting mixer 1244, a baseband filter 1246, and a baseband amplifier 1248. These devices 1242, 1244, 1246, and 1248 cascaded together, with the mixer 1244 coupled to the local oscillator (LO) 1240, are configured to convert an RF received signal RF_RX into the baseband received signal BB_RX.

The wireless communication device 1200 further includes an antenna interface 1250 and at least one antenna 1260. The transceiver 1230 is coupled to the at least one antenna 1260 via the antenna interface 1250. The antenna interface 1250 is configured to route the RF transmit signal RF_TX to the at least one antenna 1260 for wireless transmission thereof. The antenna interface 1250 is also configured to route the RF received signal RF_RX wirelessly received via the at least one antenna 1260 to the transceiver 1230. The local oscillator (LO) 1240 may include a delay locked loop (DLL) or phase locked loop (PLL) that includes any of the signal delay circuits described herein.

The following provides an overview of aspects of the present disclosure:

Aspect 1: An apparatus, including: a ring oscillator coupled between a first node and a first voltage rail; a control circuit coupled to the first node; a delay line coupled between a second node and the first voltage rail; and a voltage regulator including an input coupled to the first node and an output coupled to the second node.

Aspect 2: The apparatus of aspect 1, wherein the control circuit includes: a resistive device; a first current source coupled in series with the resistive device between a second voltage rail and the first voltage rail; a second current source coupled between the second voltage rail and the first node; and an operational amplifier including a first input coupled to a third node between the first current source and the resistive device, a second input coupled to the first node, and an output coupled to control inputs of the first and second current sources, respectively.

Aspect 3: The apparatus of aspect 2, wherein the resistive device includes a switched capacitor resistor or a thin-film resistor.

Aspect 4: The apparatus of any one of aspects 2-3, further including a leakage current compensation circuit coupled between the third node and the first voltage rail.

Aspect 5: The apparatus of aspect 4, wherein the leakage current compensation circuit includes a leakage current sensor.

Aspect 6: The apparatus of aspect 5, wherein the leakage current sensor includes a set of dummy inverters.

Aspect 7: The apparatus of aspect 5 or 6, further including a delay controller coupled to the ring oscillator and the leakage current sensor.

Aspect 8: The apparatus of any one of aspects 1-7, wherein the control circuit is configured to control an operating point of the ring oscillator.

Aspect 9: The apparatus of any one of aspects 1-7, further including a delay controller coupled to the ring oscillator.

Aspect 10: The apparatus of any one of aspects 1-9, wherein the ring oscillator includes: a ring of cascaded inverters coupled between the first node and the first voltage rail; and a set of capacitors coupled between outputs of the ring of cascaded inverters and the first voltage rail, respectively.

Aspect 11: The apparatus of aspect 10, wherein each cascaded inverter of the ring oscillator includes a set of selectable parallel inverters.

Aspect 12: The apparatus of aspect 11, further including a delay controller coupled to select inputs of the set of selectable parallel inverters.

Aspect 13: The apparatus of any one of aspects 1-12, wherein the delay line includes: a set of cascaded inverters coupled between the second node and the first voltage rail, wherein the set of cascaded inverters includes an input configured to receive an input signal, and an output configured to produce an output signal being a delayed version of the input signal; and a set of capacitors coupled between outputs of the set of cascaded inverters and the first voltage rail, respectively.

Aspect 14: The apparatus of any one of aspects 1-13, wherein the voltage regulator includes a low-dropout (LDO) regulator.

Aspect 15: The apparatus of any one of aspects 1-13, wherein the voltage regulator includes: a field effect transistor (FET) coupled between a second voltage rail and the second node; and an operational amplifier including a first input coupled to the first node, a second input coupled to the second node, and an output coupled to a gate of the FET.

Aspect 16: The apparatus of any one of aspects 1-15, further including a low pass filter (LPF) coupled to the first or second node.

Aspect 17: The apparatus of any one of aspects 1-4 and 9-16, further including a leakage current compensation circuit coupled to the first node.

Aspect 18: The apparatus of aspect 17, wherein the leakage current compensation circuit includes: a leakage current sensor; and a current mirror coupled to the leakage current sensor and the first node.

Aspect 19: The apparatus of aspect 18, wherein the leakage current compensation circuit includes a current input error amplifier configured to control a first voltage across the leakage current sensor to be related to a second voltage at the first node.

Aspect 20: A method, including: generating an oscillating signal based on a first voltage and a first current; controlling the first voltage and the first current such that a ratio of the first voltage to the first current is substantially a constant; and delaying an input signal to generate an output signal based on a second voltage related to the first voltage.

Aspect 21: The method of aspect 20, wherein controlling the first voltage and the first current includes: generating a second current related to the first current; routing the second current through a resistive device to generate a third voltage; and controlling the first and second currents based on a difference between the third voltage and the first voltage, wherein the first voltage is based on the first current.

Aspect 22: The method of aspect 20 or 21, further comprising tuning the first voltage including selectively enabling one or more parallel inverters of a ring of cascaded parallel inverters.

Aspect 23: The method of any one of aspects 20-22, further including: sensing a leakage current in a ring oscillator; and providing a compensation current to the ring oscillator based on the sensed leakage current.

Aspect 24: The method of aspect 23, wherein providing the compensation current to the ring oscillator comprises providing the compensation current to the ring oscillator via a control circuit for controlling the first voltage and the first current.

Aspect 25: An apparatus, including: means for generating an oscillating signal based on a first voltage and a first current; means for controlling the first voltage and the first current such that a ratio of the first voltage to the first current is substantially a constant; and means for delaying an input signal to generate an output signal based on a second voltage related to the first voltage.

Aspect 26: The apparatus of aspect 25, further comprising means for tuning the first voltage including for selectively enabling one or more parallel inverters of a ring of cascaded parallel inverters.

Aspect 27: The apparatus of aspect 25 or 26, wherein the means for generating the oscillating signal includes: means for sensing a leakage current in a ring oscillator; and means for providing a compensation current to the ring oscillator based on the sensed leakage current.

Aspect 28: A wireless communication device, including: one or more baseband signal processing modules; at least one antenna; a transceiver coupled to the at least one antenna and the one or more baseband signal processing modules, wherein the transceiver includes: a ring oscillator coupled between a first node and a first voltage rail; a control circuit coupled to the first node; a delay line coupled between a second node and the first voltage rail; and a voltage regulator including an input coupled to the first node and an output coupled to the second node.

Aspect 29: The wireless communication device of aspect 28, wherein the ring oscillator includes a ring of cascaded inverters coupled between the first node and the first voltage rail, wherein each cascaded inverter includes a set of selectable parallel inverters; and further including a delay controller coupled to the set of selectable parallel inverters of each cascaded inverter.

Aspect 30: The wireless communication device of aspect 28 or 29, further including a leakage current compensation circuit coupled to the first node or the control circuit.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples described herein but is to be accorded the widest scope consistent with the principles and novel features disclosed herein.

What is claimed:

1. An apparatus, comprising:
a ring oscillator coupled between a first node and a first voltage rail;
a control circuit coupled to the first node;
a delay line coupled between a second node and the first voltage rail; and
a voltage regulator including an input coupled to the first node and an output coupled to the second node, wherein the voltage regulator comprises:
a field effect transistor (FET) coupled between a second voltage rail and the second node; and
an operational amplifier including a first input coupled to the first node, a second input coupled to the second node, and an output coupled to a gate of the FET.

2. The apparatus of claim 1, wherein the control circuit comprises:
a resistive device;
a first current source coupled in series with the resistive device between a second voltage rail and the first voltage rail;
a second current source coupled between the second voltage rail and the first node; and
an operational amplifier including a first input coupled to a third node between the first current source and the resistive device, a second input coupled to the first node, and an output coupled to control inputs of the first and second current sources, respectively.

3. The apparatus of claim 2, wherein the resistive device comprises a switched capacitor resistor or a thin-film resistor.

4. The apparatus of claim 2, further comprising a leakage current compensation circuit coupled between the third node and the first voltage rail.

5. The apparatus of claim 4, wherein the leakage current compensation circuit comprises a leakage current sensor.

6. The apparatus of claim 5, wherein the leakage current sensor comprises a set of dummy inverters.

7. The apparatus of claim 5, further comprising a delay controller coupled to the ring oscillator and the leakage current sensor.

8. The apparatus of claim 1, wherein the control circuit is configured to control an operating point of the ring oscillator.

9. The apparatus of claim 1, further comprising a delay controller coupled to the ring oscillator.

10. The apparatus of claim 1, wherein the ring oscillator comprises:
a ring of cascaded inverters coupled between the first node and the first voltage rail; and
a set of capacitors coupled between outputs of the ring of cascaded inverters and the first voltage rail, respectively.

11. The apparatus of claim 10, wherein each cascaded inverter of the ring oscillator comprises a set of selectable parallel inverters.

12. The apparatus of claim 11, further comprising a delay controller coupled to enable inputs of the set of selectable parallel inverters.

13. The apparatus of claim 1, wherein the delay line comprises:
a set of cascaded inverters coupled between the second node and the first voltage rail, wherein the set of cascaded inverters includes an input configured to receive an input signal, and an output configured to produce an output signal being a delayed version of the input signal; and
a set of capacitors coupled between outputs of the set of cascaded inverters and the first voltage rail, respectively.

14. The apparatus of claim 1, wherein the voltage regulator comprises a low-dropout (LDO) regulator.

15. The apparatus of claim 1, further comprising a low pass filter (LPF) coupled to at least one of the first or second node.

16. The apparatus of claim 1, further comprising a leakage current compensation circuit coupled to the first node.

17. The apparatus of claim 16, wherein the leakage current compensation circuit comprises:
a leakage current sensor; and
a current mirror coupled to the leakage current sensor and the first node.

18. The apparatus of claim 17, wherein the leakage current compensation circuit includes a current input error amplifier configured to control a first voltage across the leakage current sensor to be related to a second voltage at the first node.

19. A wireless communication device, comprising:
one or more baseband signal processing modules;
at least one antenna;
a transceiver coupled to the at least one antenna and the one or more baseband signal processing modules, wherein the transceiver comprises:
a ring oscillator coupled between a first node and a first voltage rail;

a control circuit coupled to the first node;

a delay line coupled between a second node and the first voltage rail; and a voltage regulator including an input coupled to the first node and an output coupled to the second node, wherein the voltage regulator comprises:

a field effect transistor (FET) coupled between a second voltage rail and the second node; and an operational amplifier including a first input coupled to the first node, a second input coupled to the second node, and an output coupled to a gate of the FET.

20. The wireless communication device of claim 19, wherein the ring oscillator comprises a ring of cascaded inverters coupled between the first node and the first voltage rail, wherein each cascaded inverter comprises a set of selectable parallel inverters; and further comprising a delay controller coupled to the set of selectable parallel inverters of each cascaded inverter.

21. The wireless communication device of claim 19, further comprising a leakage current compensation circuit coupled to the first node or the control circuit.

\* \* \* \* \*